United States Patent [19]

Barnes et al.

[11] Patent Number: 4,740,761
[45] Date of Patent: Apr. 26, 1988

[54] FINE TUNING OF ATOMIC FREQUENCY STANDARDS

[75] Inventors: James A. Barnes, Boulder, Colo.; Enrico A. Rodrigo, Austin, Tex.

[73] Assignee: Austron, Inc., Austin, Tex.

[21] Appl. No.: 946,194

[22] Filed: Dec. 23, 1986

[51] Int. Cl.$^4$ ............................................. H03L 7/26
[52] U.S. Cl. ...................................... 331/3; 331/94.1
[58] Field of Search ................................... 331/3, 94.1

[56] References Cited

U.S. PATENT DOCUMENTS

| | | | |
|---|---|---|---|
| 2,699,503 | 1/1955 | Lyons et al. | 331/3 |
| 2,964,715 | 12/1960 | Winkler | 331/3 |
| 3,256,478 | 6/1966 | Dehmelt | 331/3 X |
| 3,363,193 | 1/1968 | Arnold | 331/3 |
| 3,364,438 | 1/1968 | Rorden | 331/3 |
| 3,460,052 | 8/1969 | Rader et al. | 331/10 |
| 3,729,674 | 4/1973 | Lowdenslager | 324/0.5 R |
| 4,122,408 | 10/1978 | Walls | 331/3 |

Primary Examiner—Siegfried H. Grimm
Attorney, Agent, or Firm—Dennis T. Griggs

[57] ABSTRACT

A predetermined bias voltage is applied to the input of a summing integrator in a frequency lock loop to provide fine tuning control of a voltage controlled crystal oscillator. In this arrangement, the predetermined bias voltage is summed and integrated with a phase error signal to alter the output frequency of the voltage controlled crystal oscillator. Since the servo loop operates to null the net voltage at the input of the integrator, the circuit induces a frequency error which just compensates for the intentional voltage offset bias applied to the integrator. The offset bias arrangement produces incremental offsets within a total range of about three parts in ten to the eleventh power and permits the output frequency of an atomic frequency standard to be accurately and stably adjusted in small increments to agree closely with the frequency of a national standard or other system reference.

3 Claims, 2 Drawing Sheets

FINE TUNING OF ATOMIC FREQUENCY STANDARDS

FIELD OF THE INVENTION

This invention relates generally to improvements in frequency standards, and in particular to methods and apparatus for accurately offsetting the output frequency of an atomic standard.

BACKGROUND OF THE INVENTION

The general term "atomic clock" has been loosely applied to any device that depends for its constancy of rate on the frequency of a spectral line, i.e., on the energy difference of two states, for the measurement of time intervals. In some cases they are those of an atom, e.g., the two states into which the ground state of cesium is separated in a magnetic field; in other cases they are those of a molecule, e.g., the vibration spectrum of ammonia.

Successful atomic clocks have been built employing a beam of cesium atoms. The beam is separated into two spin components, with the component made up of atoms in one of the two possible states, e.g. the spin-up state, being passed into a resonant chamber fed by an oscillator. The atoms will invert their spins and as a result, change state if the microwave frequency of the oscillator is equal to the frequency of resonance. A second separation of the beam then again gives two components with opposite spin; the relative intensities of these two may be measured and may be used to keep the oscillator in exact resonance. The period of oscillation is thus matched to the frequency of the spectral line, and the number of oscillations in a time interval may be counted by electronic means.

Such atomic frequency standards provide the most stable frequencies available. The cesium clock operated by the National Bureau of Standards requires the use of vaporized cesium metal obtained from an electric furnace. The atomic process involves a transition in the precession axis (hence electromagnetic field) of the outer electron of the cesium atom. The required radio frequency is 9,192,631,770 Hz (cycles per second) and the accuracy is to a variation of less than one part in ten to the thirteenth power.

National standards laboratories maintain large ensembles of such atomic clocks to form the legal bases of time within their countries. These clock ensembles (or "time scales") are compared internationally by the International Time Bureau (BIH), in Paris, France, to form International Atomic Time (TAI). The BIH also forms a time scale called UTC which is a compromise between pure atomic time (TAI) and "earth time" (UTI). Almost all nations base their official time on UTC shifted by an integer number of hours corresponding to the appropriate time zones. Each participating standards laboratory steers its realization of UTC to approximate the BIH realization.

Besides the national standards laboratories, many organizations need atomic clock accuracy for various systems. Examples include telecommunications systems, electronic navigation systems such as Loran-C, Transit, and the Global Positioning System, and scientific laboratories. There are now tens of thousands of atomic clocks in use in such applications.

Although atomic clocks can realize rate accuracies of one part in ten to the twelfth power, or better, these inaccuracies can accumulate to several tens of microseconds error in a year's time. Although this may seem insignificant, many systems need this level of accuracy and could use even more. Like all clocks, atomic clocks drift out of synchronism with a master clock. The difference is only in the size of the numbers, not their importance.

Atomic clocks are more stable in frequency than they are accurate in frequency. That is, once set, the frequency of a typical cesium beam standard changes only slightly (1.0e-13). As delivered, however, the cesium beam frequency might differ from the international standard by as much as $+/-5.0e-12$. Accordingly, it is desirable to have the capability of fine tuning adjustments ($+/-3.0e-11$) on atomic frequency standards. By such means, the frequency of the local clock could be adjusted or offset to agree more closely with the national standards or other system reference.

Moreover, the internationally recognized time scales are deliberately adjusted from time to time. At the end of each year it may be necessary to adjust the recognized time scales to account for fluctuations in the primary frequency standard. Of course, to maintain the usefulness of the atomic frequency standards, it is desirable to offset their outputs to conform to the national standard.

DESCRIPTION OF THE PRIOR ART

The output frequency of most atomic clocks depends on the constant ("C-field") magnetic field impressed on the atoms in the interaction region. This is known as the Zeeman field. One known method for fine tuning the output frequency of atomic clocks is to alter the C-field. Several years ago, however, it was discovered that such C-field adjustments were not reliable. After a C-field adjustment, the frequency was often seen to relax back almost to where it started. Most of such stability problems have been traced to the magnetic shields and their hysteresis effects. Experts now generally discourage C-field adjustments to fine tune the clock.

Other prior art methods have utilized elaborate frequency synthesis systems with complex frequency divider adjustments to alter the output frequency of the atomic resonance device.

Such prior art arrangements have provided a minimum step adjustment resolution of about fifty parts in ten to the tenth power. Recent improvements in electronic phase shifters have provided some improvement in resolution, but at a substantial expense. Typical atomic frequency standards agree to within one part in ten to the eleventh power, and it is these small differences which need to be tuned out.

OBJECTS OF THE INVENTION

The principal object of the present invention is to provide an improved atomic frequency standard whose output frequency can be selectively increased or decreased electronically over a very small range.

A related object of the invention is to provide an atomic frequency standard in which the output frequency can be accurately and stably adjusted in small amounts to agree closely with a national standard or other system reference.

SUMMARY OF THE INVENTION

According to the present invention, there is provided a system wherein the frequency of a voltage controlled crystal oscillator is stabilized by comparing its output with that of a frequency standard derived from an atomic or molecular resonance apparatus. In the preferred embodiment, a cesium beam tube is adapted to resonate at a prescribed transition frequency. The output of the oscillator is phase modulated and synthesized to produce a transition frequency which is applied to the input of the cesium beam resonator. The output current of the cesium beam resonator is synchronously detected and steers the local oscillator frequency.

The magnitude and sense of the error signal is a function of the difference between the resonatrr transition frequency and the synthesized frequency. The error signal is integrated, and the smoothed output of the integrator is applied to the input of the voltage controlled crystal oscillator. The foregoing circuit constitutes a closed servo loop which operates to null the input voltage to the integrator. The integrator is characterized by a high DC gain and a relatively long time constant. The integrator is responsive to the error signal output of the phase detector for controlling the output frequency of the voltage controlled crystal oscillator whereby any relatively slow variation of the synthesized frequency with respect to the resonator transition frequency is corrected.

According to an important feature of the invention, a predetermined bias voltage is applied to the input of a summing integrator in the frequency-lock loop to provide fine tuning of the synthesized transition inducing signal. In this arrangement, the servo loop acts to null the input voltage to the integrator which is now the sum of the detected error signal and the intentional bias voltage. In a sense, the bias voltage causes the servo to run at an "offset" (i.e., biased) frequency.

Long time constant variations in the output of the crystal oscillator are corrected automatically by the feedback signal applied through the integrator to the input of the voltage controlled crystal oscillator. Moreover, since the servo loop operates to null the net voltage at the input of the integrator, the circuit induces a frequency error which just compensates for the intentional voltage offset bias on the integrator.

Operational features and advantages of the present invention will be appreciated by those skilled in the art upon reading the detailed description which follows in connection with the attached drawings.

DETAILED DESCRIPTION OF THE PREFERRED EMBODIMENT

Figure 1:
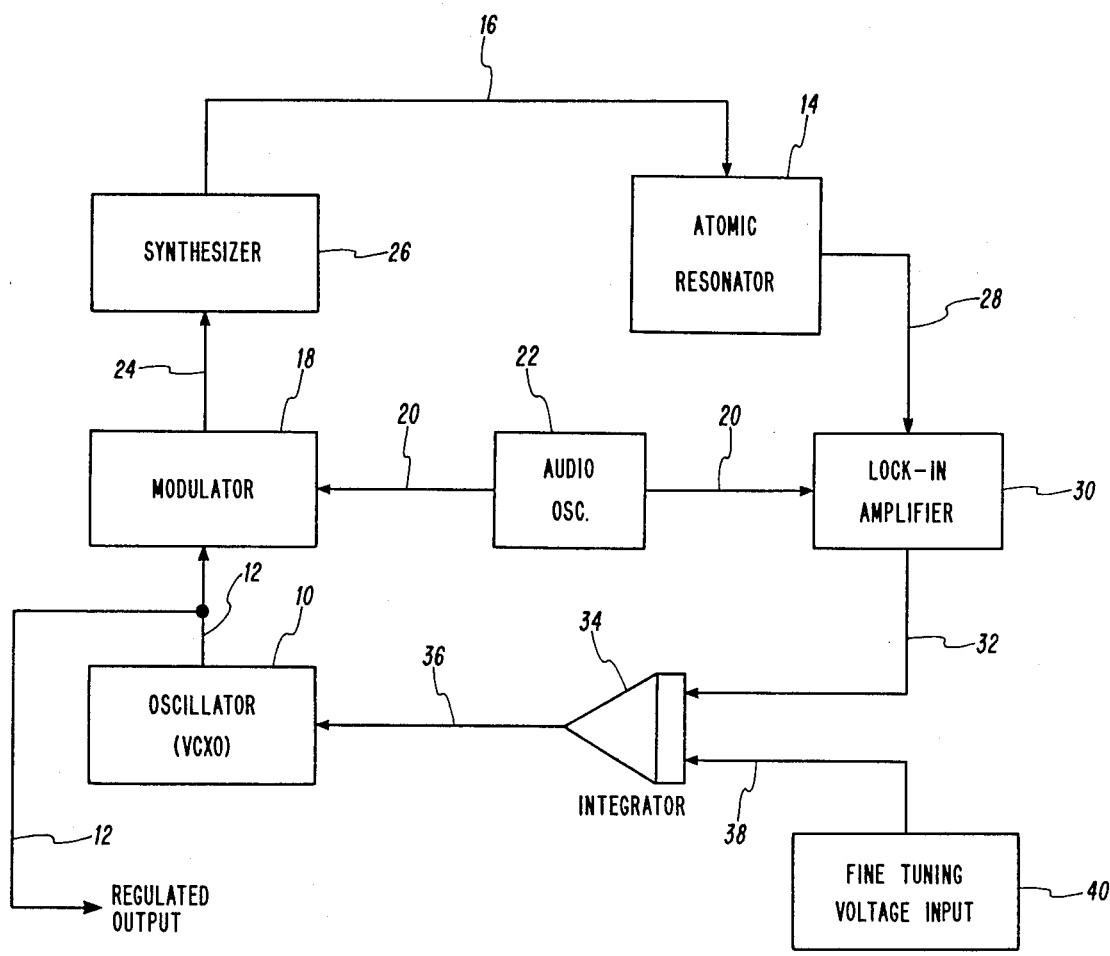
FIG. 1 is a simplified block diagram of a frequency stabilizing system in which the output of a crystal oscillator is stabilized by an atomic resonator, and in which electronic means are provided for fine tuning the operating frequency of the atomic resonator; and, FIG. 2 is an expanded block diagram which illustrates a preferred embodiment of the present invention.

In the description which follows, like parts are indicated throughout the specifications and drawings with the same reference numerals, respectively.

Referring now to FIG. 1 of the drawing, a crystal controlled oscillator 10 produces an output signal 12, the frequency of which is to be stabilized with reference to the quantum mechanical transition frequency of an atomic or molecular resonance apparatus 14, for example, a cesium beam resonator. An excitation frequency signal 16 is derived from the oscillator output signal 12.

The regulated output 12 of the oscillator 10 is first applied as one input to a phase modulator 18. The regulated output signal is modulated by a low-frequency reference signal 20 which is produced by oscillator 22. In this modulation arrangement, the regulated output signal 12 serves as the carrier, and the low-frequency reference signal 22 serves as the information signal. The output 24 of the phase modulator 18 is applied to the input of a synthesizer 26 which produces the hyperfine transition inducing signal 16. The synthesizer 26 includes frequency multipliers, harmonic and sub-harmonic generators, which are responsive to the phase modulated driving signal 24 to produce the hyperfine transition inducing signal 16, near the hyperfine transition resonance center frequency, $f_r$.

Since the transition inducing signal 16 is modulated at a relatively low frequency, for example, 500 Hz, the output 28 of the atomic resonator 14 contains the frequency error information at the same low frequency. The phase of the audio output signal 28 is compared with the phase of the low frequency reference signal 20 in a lock-in amplifier 30 which includes a phase detector circuit. Phase comparison is utilized to achieve a phase lock of the reference signal 12 produced by the voltage controlled oscillator 10 with the phase of the output signal 28 produced by the resonator 14.

The number of atomic state transitions in the atomic frequency resonator 14 is maximum when the frequency of the phase modulated transition inducing signal 16 is equal to the hyperfine transition resonance center frequency of the resonator 14. When the frequency of the transition inducing signal 16 is less or greater than the hyperfine transition resonance center frequency, the number of transitions occurring will be less than maximum by an amount representative of the frequency difference.

The time distribution of the state transitions varies in accordance with the difference between the center frequency of the phase modulated transition inducing signal 16 and the hyperfine transition resonance center frequency. When the frequency of the inducing signal and the resonance center frequency coincide, the output signal 28 produced by the resonator 14 is in phase with the reference signal 20, with the result that the output 32 of the lock-in amplifier 30 is zero.

The phase of the resonator output signal 28 and the phase of the reference signal 20 are compared by the phase detector in the lock-in amplifier 30 and generates a DC error signal 32 whose polarity depends upon the relative phases of the compared frequency signals and whose magnitude is proportional to the deviation of the center frequency of the inducing signal with respect to the resonant center frequency of the resonator.

When the center frequency of the phase modulated signal is greater than the hyperfine transition resonance center frequency, a positive error signal proportional to the phase difference is generated, and, when the center frequency is less than the resonance center frequency, a negative error signal proportional to the phase difference is issued from the lock-in amplifier 30.

The output signal 32 from the lock-in amplifier is applied to the input of the voltage controlled oscillator 10 through a summing integrator 34. The error signal 32 is smoothed by the integrator 34 to produce a DC correction signal 36.

The foregoing circuit comprises a phase locked loop which is responsive to changes of the error signal output from the resonator 14. Accordingly, such changes are swiftly compensated in response to the DC correction signal which is applied to the input of the oscillator 10. A short-term transient error induced by noise in the modulator or synthesizer circuit is compensated, with the error signal 32 being returned to a null condition after the transient has dissipated. If, however, there is an error signal due to drift or aging of the crystal utilized in the oscillator 10, an error signal 32 is produced which increases or decreases the output frequency 12 of the oscillator until the frequency offset is corrected.

As previously noted, it is sometimes desirable to selectively increase or decrease the output frequency of the standard 14 without altering its physical properties. According to the present invention, the hyperfine transition resonance center frequency of the atomic resonator 14 remains fixed, and a DC bias offset signal 38 is applied to the input of the summing integrator 34 in the frequency-lock loop. Since the frequency-lock loop operates to null the net voltage at the input to the integrator, a phase error signal 32 will be produced which just compensates for the intentional offset produced by bias signal 38. This produces a corresponding increase or decrease in the oscillator output frequency of signal 12, and the synthesizer 26 continues to translate its input frequency by a constant factor.

Figure 2:
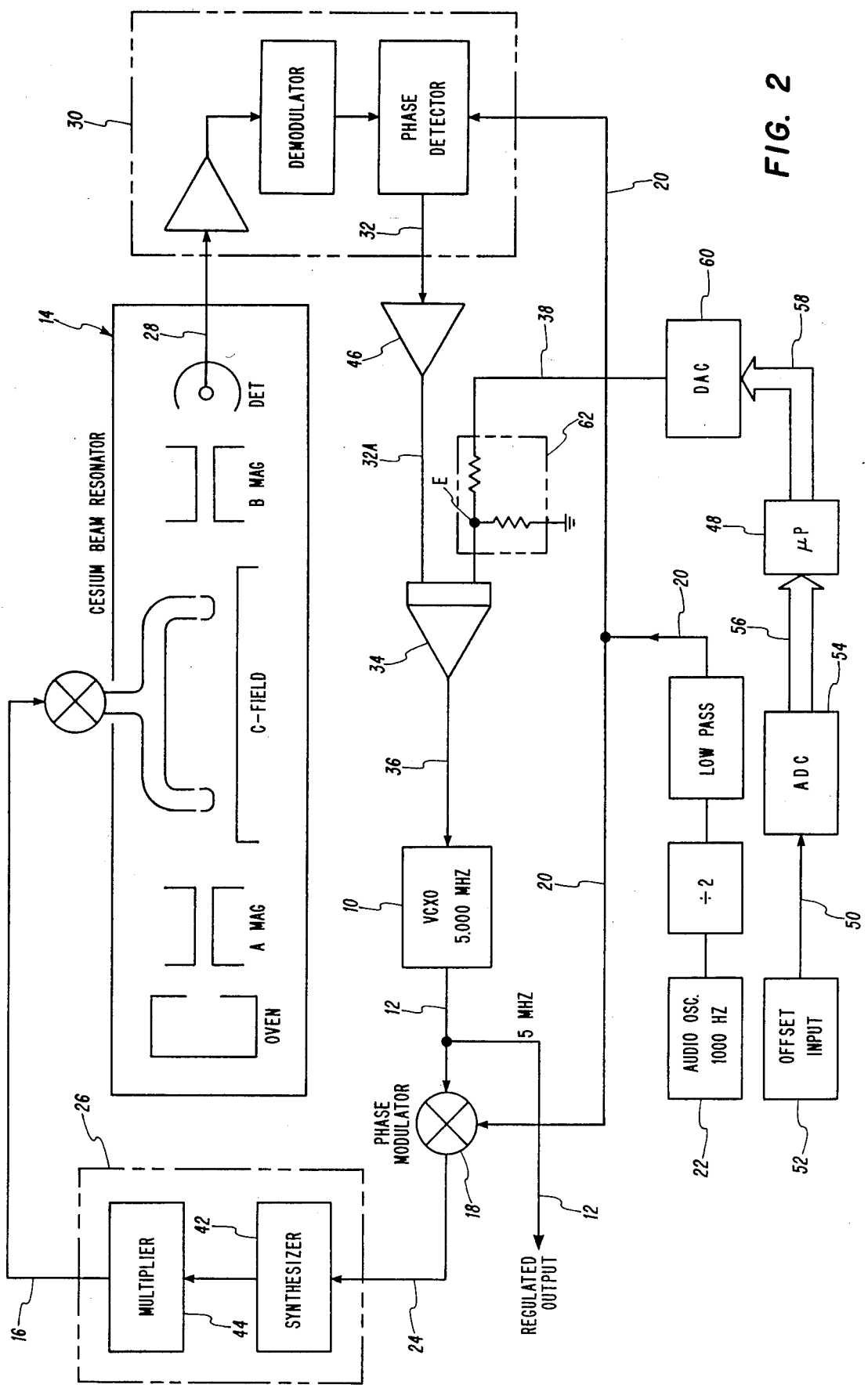

The manner by which an incremental adjustment of the output frequency of the resonator 14 is produced can best be understood by considering the operation of an adjustable frequency standard as represented by the preferred embodiment of the invention as shown in FIG. 2. Initially, the regulated output signal 12 produced by the voltage controlled crystal oscillator 10 is phase modulated by modulator 18 and is transformed by a synthesizer circuit 42 within the synthesizer circuit 26 to produce a hyperfine transition inducing signal 16 having a center frequency $f_c$ which equals the hyperfine transition resonance center frequency $f_r$ of the cesium beam resonator 14. The frequency of the regulated output signal 12 produced by the voltage controlled crystal oscillator standard is established at an initial frequency $f_1$.

To adjust the output frequency of the atomic standard to a higher frequency relative to its initial frequency, the DC correction signal 36 produced by the integrator 34 is altered by the integration of a bias voltage E produced by the DC bias signal 38 to change the frequency of output signal 12 produced by the local oscillator 10 by an incremental amount proportionately related to the difference between the initial frequency $f_1$ and the desired higher frequency $f_2$. As a result of this incremental frequency shift, the synthesized center frequency $f_c$ is shifted to a new frequency higher than its initial value by an amount proportional to the difference between $f_1$ and the desired $f_2$. For a synthesizer, $f_{out}/f_{in}$ = constant. Thus the output of the synthesizer must have the same proportionate change as the input. Since the hyperfine transition resonance center frequency $f_r$ and the new synthesized center frequency $f_c$ no longer coincide, an error signal 32 is produced which is proportionately related to the difference between $f_r$ and $f_c$. The error signal is amplified by amplifier 46 to produce an amplified error signal 32A which is applied to one of the inputs of the summing integrator 34. The bias signal E and the amplified error signal 32A are summed and integrated by integrator 34. This requires that $f_o$ is sufficiently greater than $f_r$ to produce the balancing voltage 32A to offset the bias voltage E.

A bias voltage E of one millivolt will produce a frequency offset of approximately one part in ten to the twelfth power. Since typical frequency standards have linewidths of about 500 Hz, or about 5.0e-8, tunability over a range of +/−3.0e-11 covers about 0.1 percent of the linewidth and produces reasonably linear tuning over the +/−3.0e-11 range.

The fine tuning DC bias signal 38 is produced digitally in the preferred embodiment by a microprocessor 48. In the arrangement shown in FIG. 2, an analog offset signal 50 is manually selected in an offset input unit 52. The analog offset signal 50 is converted to a digital data word by an analog/digital converter 54. The digital data word is input through databus 56 to the microprocessor 48. The microprocessor 48 generates a unique digital data word which corresponds with the desired offset increment and applies it through a databus 58 to the input of a digital/analog converter 60. The output 38 of the digital/analog converter 60 is a precision DC bias signal which produces the desired bias voltage E at the output node of a voltage divider circuit 62.

Although the invention has been described with reference to a specific embodiment, and with reference to a specific cesium beam resonator standard, the foregoing description is not intended to be construed in a limiting sense. Various modifications of the disclosed embodiment as well as alternative applications of the invention will be suggested to persons skilled in the art by the foregoing specification and illustrations. It is therefore contemplated that the appended claims will cover any such modifications or embodiments that fall within the true scope of the invention.

What is claimed is:

1. A frequency adjustable stabilized frequency standard comprising an atomic frequency resonator for providing a signal at a frequency corresponding to a quantum mechanical transition resonance frequency, a variable frequency oscillator for generating a frequency standard signal at a first selected frequency, a low frequency oscillator whose frequency of oscillation is relatively low compared to the output frequency of the variable frequency oscillator, a phase modulator coupled to receive the variable frequency oscillator signal and the low frequency oscillator signal and operable to generate a phase modulated output signal, frequency multiplier means coupled to receive said modulated output signal and to generate therefrom a hyperfine transition inducing signal whose frequency is a multiple of the output frequency of said variable frequency oscillator, means for comparing the phase of the output signal produced by the atomic frequency resonator in response to the application of said hyperfine transition inducing signal with the phase of said low frequency oscillator signal to generate an error signal representative of their phase difference, a summing integrator for producing in response to said error signal a smoothed correction signal, said integrator having an input and an output, the input of said integrator being coupled to the phase comparing means for receiving said phase error signal, and the output of said integrator coupling the smoothed correction signal to the input of said variable frequency oscillator, and bias means coupled to the input of said summing integrator for offsetting said error signal with a fixed bias signal.

2. In a stabilized frequency standard of the type including an atomic frequency resonator for providing a signal at a frequency corresponding to a quantum mechanical transition resonance frequency, a variable frequency oscillator for generating a frequency standard signal at a selected frequency, a low frequency oscillator for generating a relatively low frequency modulation signal, a phase modulator for phase modulating the variable frequency oscillator output signal with said relatively low frequency modulation signal, frequency transforming means coupled to receive said phase modulated signal for producing a hyperfine transition inducing signal for application to said atomic frequency resonator, phase detector means coupled to the output signals of said atomic resonator and said low frequency oscillator for detecting a difference in phase between the two signals and for producing an error signal proportional thereto, and including a summing integrator coupled to receive said error signal and producing in response thereto a smoothed correction signal for altering the output frequency of the variable frequency oscillator, the improvement comprising bias means coupled to the input of said summing integrator for offsetting said error signal with a fixed bias signal.

3. A method for providing fine tuning control of an output signal produced by a voltage controlled oscillator of the type biased by reference to the output signal of a primary frequency standard, whereby the frequency of the voltage controlled oscillator can be adjusted to agree with a standard system reference, comprising the steps of modulating the output of the voltage controlled oscillator by a low frequency reference signal; synthesizing the phase modulated oscillator output signal to produce a transition inducing signal; applying the transition inducing signal to the input of a primary resonator; comparing the phase of the output signal produced by the primary resonator with the phase of the low frequency reference signal; deriving an error signal which is proportional to said phase difference; summing said error signal with a bias signal; integrating the sum of the error signal and bias signal to produce a correction signal; and, applying the correction signal to the input of the voltage controlled oscillator.

* * * * *

UNITED STATES PATENT AND TRADEMARK OFFICE
CERTIFICATE OF CORRECTION

PATENT NO. : 4,740,761

DATED : 4/26/88

INVENTOR(S) : James A. Barnes, Enrico A. Rodrigo

It is certified that error appears in the above-identified patent and that said Letters Patent is hereby corrected as shown below:

Column 3, line 11, "resonatrr" should be -- resonator --.

Signed and Sealed this

First Day of November, 1988

*Attest:*

DONALD J. QUIGG

*Attesting Officer*          *Commissioner of Patents and Trademarks*